(12) United States Patent
Choi et al.

(10) Patent No.: US 8,110,990 B2
(45) Date of Patent: Feb. 7, 2012

(54) ATMOSPHERIC PRESSURE PLASMA APPARATUS

(75) Inventors: Bum Ho Choi, Kwangju (KR); Jong Ho Lee, Kwangju (KR); Jung Chan Bae, Kyounggi (KR); Yong-Seok Park, Seoul (KR); Chun-Seong Park, Suwon-si (KR); Woo Sam Kim, Seoul (KR); Gil Sik Lee, Plano, TX (US); Lawrence John Overzet, Richardson, TX (US); Byeong Jun Lee, Daegu (KR)

(73) Assignees: Korea Institute of Industrial Technology, Cheonana-Si, Chungcheongnam-Do (KR); Board of Regents, The University of Texas System, Austin, TX (US)

( * ) Notice: Subject to any disclaimer, the term of this patent is extended or adjusted under 35 U.S.C. 154(b) by 409 days.

(21) Appl. No.: 12/314,358

(22) Filed: Dec. 9, 2008

(65) Prior Publication Data
US 2010/0033096 A1 Feb. 11, 2010

(30) Foreign Application Priority Data
Aug. 8, 2008 (KR) .................. 10-2008-0078185

(51) Int. Cl.
*H05B 31/26* (2006.01)
(52) U.S. Cl. .......... 315/111.21; 315/111.71; 315/111.91
(58) Field of Classification Search .................. 315/111.21–111.91; 118/723 E, 118/723 R, 724–732; 156/345.43, 345.44; 219/121.36, 121.43
See application file for complete search history.

(56) References Cited

U.S. PATENT DOCUMENTS

| | | | |
|---|---|---|---|
| 5,627,435 A * | 5/1997 | Jansen et al. ............ | 315/111.21 |
| 6,331,754 B1 * | 12/2001 | Satoyoshi et al. ....... | 315/111.51 |
| 6,441,553 B1 * | 8/2002 | Yializis et al. .......... | 315/111.21 |
| 7,632,379 B2 * | 12/2009 | Goto et al. .............. | 156/345.44 |
| 2006/0130756 A1 * | 6/2006 | Liang et al. ............. | 118/715 |
| 2009/0102385 A1 * | 4/2009 | Wi ........................... | 315/111.21 |
| 2009/0162263 A1 * | 6/2009 | Chang et al. ............ | 422/186.04 |

* cited by examiner

*Primary Examiner* — Tung X Le
(74) *Attorney, Agent, or Firm* — The Nath Law Group

(57) ABSTRACT

Disclosed is an atmospheric pressure plasma apparatus for enhancing and or controlling the dissociation of a secondary gas by converting a source gas into a plasma state at atmospheric pressure and controlling the interaction between that plasma and the secondary gas using porous metal, and ceramic tubes to create a path having controllable isolation from the region where plasma is generated.

8 Claims, 14 Drawing Sheets

ATMOSPHERIC PRESSURE PLASMA APPARATUS

BACKGROUND OF THE SUBJECT MATTER

The present subject matter relates to atmospheric pressure plasma apparatus, and more particularly to an atmospheric pressure plasma apparatus for enhancing dissolvability of a secondary gas by converting a source gas into a plasma state in an atmospheric state and passing a secondary gas through a path isolated from a region where plasma is generated.

Plasma is generally defined as a state of matter composed of ions, electrons, radicals, and a variety of neutral species, by an electric field, to be in an electrically neutral state. Such plasma is widely used in numerous applications such as modifying surface properties of materials, etching, coating, sterilization, disinfecting, generating ozone, dyeing, cleaning waste water, cleaning faucet water, air cleaning, and high-gain lamps, and so forth employing ions, electrons, and radicals therein.

Plasma is classified into low-pressure plasma (several mm Torr to several Torr) and high-pressure plasma (several Torr to 760 Torr), depending on the pressure created. Low pressure plasma is easily generated, but shows several disadvantages. For example, since vacuum chambers and exhaust apparatus are required to maintain a low state, low plasma suffers from the disadvantage of high expense. In addition, it is difficult to produce low pressure plasma on a large scale by adopting batch type.

On the other hand, high-pressure plasma is created in atmospheric pressure (760 Torr). As a result, expensive vacuum systems are not required, and it is possible to produce high-pressure plasma on a large scale by employing continuous process.

Meanwhile, when high voltage is applied to two separated electrodes and source gas is supplied therebetween, the source gas becomes ionized and dissolved to generate plasma.

In the event that a secondary gas is supplied to a region where the plasma is generated, it collides with particles such as ions, electrons, and radicals, which are formed by dissolving the source gas, so that the molecular combination of the secondary gas becomes disconnected to ionize molecules. Accordingly, the atmospheric pressure plasma apparatus are now applied employing ionized source gas to a broad range of fields, including processing such as modifying surface properties, etching, deposition, nanotube-growth, and so forth.

In conventional atmospheric pressure plasma apparatuses, however, the source gas is converted into plasma in a region where plasma is generated between two electrodes. Then, the secondary gas is ionized in the region where plasma is generated, which is to be injected to outside via one of two electrodes. As a result, dissolved secondary gas collides against a path capable of passing one of two electrodes. For this reason, the conventional atmospheric apparatus, however, have the drawback in which the reagent of the dissolved secondary gas is lost.

In other words, after the source gas is provided to a region where plasma is created to be dissolved, it is injected to the outside. Thus, there is a disadvantage that the reagent of the secondary gas is dissolved under injection process.

SUMMARY OF THE SUBJECT MATTER

Accordingly, various embodiments of the present subject matter are configured to overcome the drawback in the prior art and to provide an atmospheric pressure plasma apparatus capable of minimizing the loss of reagent of a secondary gas which is dissolved to be injected into a processing object or a processing region by separately passing through a region in which source gas is converted into a plasma state.

Some embodiments according to the present subject matter provide an atmospheric pressure plasma apparatus comprising: a first electrode being porous and having a plurality of first penetrating holes; a second electrode forming an isolating space apart from the first electrode as far as a predetermined distance having second penetrating holes corresponding to the first penetrating holes and a plurality of first connecting holes for connecting the isolating space and an outer region; and a ceramic nozzle penetrating the first and second penetrating holes to be connected to the outer region, wherein a source gas is provided to the isolating space through the first electrode, and wherein a secondary gas passes the isolating space through the ceramic nozzle to the outer region, and wherein a radio frequency power supply is applied to the first and second electrodes to generate plasma in the isolating space from the source gas supplied through the first electrode, and wherein the plasma is injected to the outer region through the first connecting holes, and wherein if the secondary gas passing the isolating space through the ceramic nozzle is injected to the outer region, the plasma and the secondary gas is mixed in the outer region.

Additionally, various embodiments of the present subject matter provide an atmospheric pressure plasma apparatus that is configured such that each end of the ceramic nozzle is positioned in each of the mixing grooves.

Further, various embodiments of the present subject matter provide an atmospheric pressure plasma apparatus comprising: an atmospheric pressure plasma apparatus comprising a housing having an internal space including a gas supplying part and an apparatus mounting part, wherein a secondary gas chamber is formed in the gas supplying part, and a source gas supplying pipe is formed inside wall of the gas supplying part; a nozzle holder mounted on the apparatus mounting part of the housing and formed in a shape to include a source gas chamber defined by a bottom and sidewalls of the housing, the nozzle holder having an external diameter smaller than an internal diameter of the mounting part to supply a source gas from the source gas supplying pipe to a source-gas guide region of the housing, the nozzle holder including a plurality of third penetrating holes in the bottom thereof, the nozzle holder including at least one source gas supplying hole for connecting the source-gas guide region and the source gas chamber; a subsidiary electrode mounted on the nozzle holder, having the external diameter the same as that of the nozzle holder, and formed in a shape of a disk whose center's a predetermined region is empty; a disk-shaped first electrode mounted on the subsidiary electrode, including a plurality of first penetrating holes corresponding to the third penetrating holes of the nozzle holder, and formed of porous materials; an electrode insulator formed in a shape having an internal diameter the same as or greater than an external diameter of the subsidiary electrode, mounted on the first electrode with sidewalls of the subsidiary electrode and the first electrode covered, and including a bottom whose center's predetermined region is empty; a disk-shaped second electrode mounted on the electrode insulator, having the same diameter the same as an external diameter of the electrode insulator, forming a isolating space apart from the first electrode as far as a predetermined distance by the electrode insulator, including a first connecting hole for connecting the isolating space and an outside, and including a second penetrating hole corresponding to the first penetrating hole; a ceramic nozzle included so as to penetrate the third penetrating hole of the nozzle holder, the first penetrating hole of the first electrode, and the second penetrating hole of the second chamber; and a cap exposing a central region of the second electrode and sealing the internal space of the housing by simultaneously covering an edge of the second electrode and a predetermined region of the housing, and wherein a radio frequency power supply is applied to the first and second electrodes to generate plasma in the isolating space from the source gas supplied through the first electrode, and wherein the plasma is injected to the outer region through the first connecting holes, and wherein if the secondary gas passing the isolating space through the ceramic nozzle is injected to the outer region, the plasma and the secondary gas is mixed in the outer region.

In some embodiments according to the present subject matter, the ceramic nozzle penetrating the second electrode and the first connecting hole may comprise at least one unit cell covered with at least one second connecting hole on the ceramic nozzle and may be disposed on the second electrode.

In further embodiments, a cover is further included. The cover is disposed between the second electrode and the housing, having the external diameter the same as that of the second electrode, including at least one mixing groove, and a second connecting hole for connecting the mixing groove and the outside. At least one connecting hole and at least one ceramic nozzle are connected to provide the secondary gas and plasma to each of the mixing grooves. The secondary gas mixed with the plasma is injected to the outside through second connecting hole.

Additionally, embodiments of the present subject matter provide an atmospheric pressure plasma apparatus comprising configured such that each the ends of the ceramic nozzle is positioned in each of the mixing grooves.

In other embodiments, an electrode connecting rod is further included. However, when it is included, the electrode connecting rod may be connected to the outside power supply in the bottom of the subsidiary electrode. The electrode connecting rod may be configured to penetrate the nozzle holder which is to be extended to the gas supplying part.

In yet other embodiments, a housing insulator is further included. The housing insulator is capable of insulating the housing and the secondary gas on walls corresponding to the gas supplying part of the housing.

BRIEF DESCRIPTION OF THE DRAWINGS

The accompanying drawings are included to provide a further understanding of the subject matter. The drawings are incorporated herein by reference and constitute a part of this specification. The drawings illustrate example embodiments of the present subject matter and, together with the description, serve to explain principles of the present subject matter. In the drawings.

DETAILED DESCRIPTION OF PREFERRED EMBODIMENTS

Figure 1:
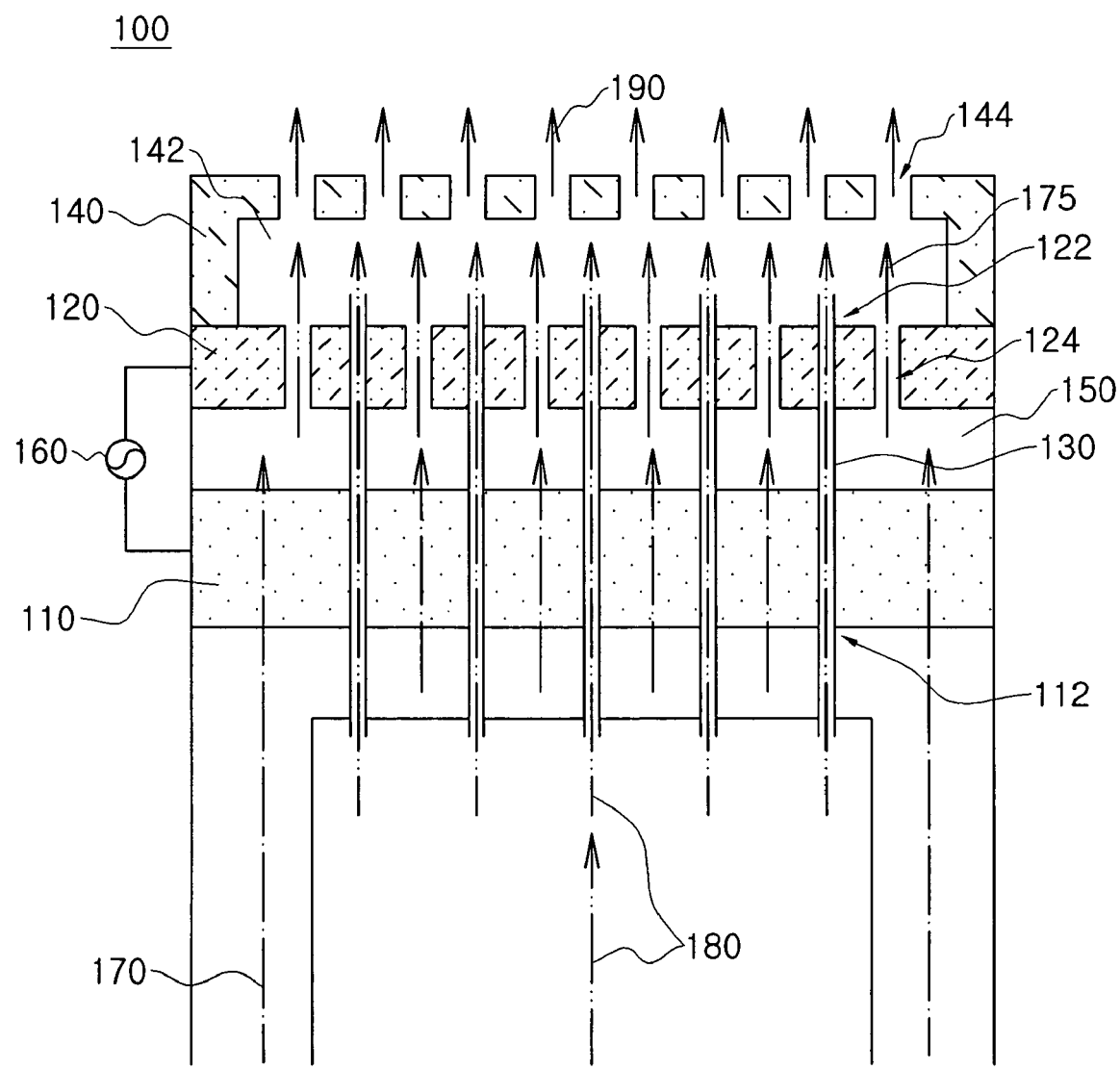
FIG. 1 shows the conception of an atmospheric pressure plasma apparatus in accordance with an embodiment of the present subject matter.

Preferred embodiments of the present subject matter will be described below in more detail with reference to the accompanying drawings. The present subject matter may, however, be embodied in different forms and should not be constructed as limited to the embodiments set forth herein. Rather, these embodiments are provided so that this disclosure will be thorough and complete, and will fully convey the scope of the subject matter to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIG. 1 shows the conception of an atmospheric pressure plasma apparatus in accordance with an embodiment of the present subject matter.

Referring to FIG. 1, the atmospheric pressure plasma apparatus 100 according to an embodiment of the present subject matter includes a first electrode 110, a second electrode 120, and a ceramic nozzle 130. Also, a cover may be further included on the second electrode 120. The first electrode 110 includes a plurality of first penetrating holes and is made of porous materials in which source gas is easily passed, such as, for example, hydrogen, helium. In this case, the first penetrating hole 112 has a predetermined diameter enough for a ceramic nozzle to be penetrated and arranged regularly.

The second electrode 120 includes a plurality of second penetrating holes at a position corresponding to the first penetrating hole 112 of the first electrode 110. The ceramic nozzle 130 penetrates the first and second penetrating holes 110 and 120. The ceramic nozzle 130 will be more fully described hereinafter.

As shown, the first and second electrodes 110 and 120 are isolated at predetermined distance to such that an isolating space 150 is formed. The isolating space 150, which is not shown in FIG. 1 in detail, means a space isolated by the housing together with the first and second electrodes 110 and 120. According to one embodiment of the present subject matter, plasma is generated in the isolating space 150. Thus, the isolating space 150 means a plasma generating region.

The second electrode 120 includes a plurality of first connecting holes 124. The first connecting hole 124 performs a function as a path to connect the isolating space 150 to the outside as well as to inject plasma generated in the isolating space 150 to the outside.

The ceramic nozzle 130 penetrates the first and second electrodes 110 and 120 to be formed. That is, the ceramic nozzle 130 is formed by penetrating the first and second electrodes 110 and 120 via the first penetrating hole 112 of the first electrode 110 and the second penetrating hole 122 of the second electrode 120. As shown in FIG. 1, one end of the ceramic nozzle 130 is formed to be capable of supplying secondary gas, and the other end thereof is protruded from the second electrode 120 at a predetermined length to inject a primary gas. In this case, the ceramic nozzle 130 crosses over the isolating space 150, that is, the plasma generating region. The reason for this is that the secondary gas is provided through the ceramic nozzle 130 with isolating plasma in the plasma generating region.

The cover 140 may be disposed on the second electrode 120. The cover 140 performs a function to form mixed gas by mixing plasma injected through the first connecting hole 124 and the secondary gas injected through the ceramic nozzle 130, and then injects the mixed gas. In this case, the cover 140 includes at least one mixing groove 142 (only one is shown in FIG. 1) on a surface contact therewith. The mixing groove 142 conformally mixes the plasma injected from the first connecting hole 124 and the secondary gas injected from the ceramic nozzle 130, and then injects the mixture to the outside. That is, each of the ends of the ceramic nozzle 130 is positioned in each of the mixing grooves 142.

The operation of the atmospheric pressure plasma apparatus 100 in accordance with an embodiment of the present subject matter will be described hereinafter.

A power supply 160 is connected to the first and second electrodes 110 and 120. In this case, a source gas 170 is supplied to the atmospheric pressure plasma apparatus 100. The source gas 170 penetrates the first electrode 110 to be supplied to the isolating space 150 between the first and second electrodes 110 and 120. The first electrode 110 is made of porous materials. The source gas 150 is phase-changed into plasma 175 by the power supply, which is applied to the first and second electrodes 110 and 120 at the one and the other end of the isolating space 150.

The plasma 175 is injected to the outside through the first connecting hole 124 of the second electrode 120.

A secondary gas 180 penetrates the first electrode 110, the isolating space 150, and the second electrode 120 through the ceramic nozzle 130 to the outside in a space isolated from the source gas 170.

In the event that the cover 140 is disposed on the second electrode 120, the plasma 175 injected through the first connecting hole 124, and the secondary gas 180 injected from the ceramic nozzle 130, are conformally mixed and then injected to the outside as the mixed gas 190 through the second connecting hole 144, which is arranged regularly.

According to an embodiment of the atmospheric pressure plasma apparatus 100, the source gas 170 passes the first electrode 110 to be supplied to the isolating space 150. The source gas 170 is phase-changed into plasma, and then conformally injected to the outside through the first connecting hole 124 of the second electrode 120. The secondary gas 180 passes the isolating space 150 through the ceramic nozzle 130, isolating the plasma generated in the plasma generating region. Then, the secondary gas 180 is injected through the ceramic nozzle 130 which is protruded at a predetermined length from the second electrode 120 and mixed with the plasma injected through the first connecting hole 124 to be conformally dissolved. As a result, the reagent of the secondary gas 180 is improved.

At this time, it does not mean that the secondary gas 180 is dissolved in the plasma generating region to be injected to the outside, but that the secondary gas 180 is reacted with the plasma in the outside to be dissolved, so that the movable course of the dissolved secondary gas 180 becomes shortened, thereby minimizing the loss of reagent of the dissolved secondary gas 180.

In the atmospheric pressure plasma apparatus 100 in accordance with the present subject matter, the first connecting hole 124 and the ceramic nozzle 130 are conformally arranged on the second electrode 120, thereby generating conformal plasma in the light of space. Also, the secondary gas 180 dissolved by the plasma is conformally generated, thereby improving the dissolvability of the secondary gas 180.

As mentioned above, such atmospheric pressure plasma apparatus 100 may be used in numerous applications such as modifying surface properties of materials, etching, coating, sterilization, disinfecting, generating ozone, dyeing, cleaning waste water, cleaning faucet water, air cleaning, and high-gain lamps, and nanotube growing.

EXAMPLE 1

FIGS. 2 and 3A to 3H are partial cross-sectional perspective views of an atmospheric pressure plasma apparatus in accordance with a first embodiment of the present subject matter. FIGS. 3A to 3H show each of the parts of FIG. 2 in detail.

Referring to FIGS. 2 and 3A to 3H, an atmospheric pressure plasma apparatus 100 according to the first embodiment of the present subject matter comprises a housing 210, a nozzle holder 220, a subsidiary electrode 230, a first electrode 240, an electrode insulator 250, a second electrode 260, and a cap 280. The atmospheric pressure plasma apparatus 100 further includes a cover 270 between the second electrode 260 and the cap 280.

Figure 2:
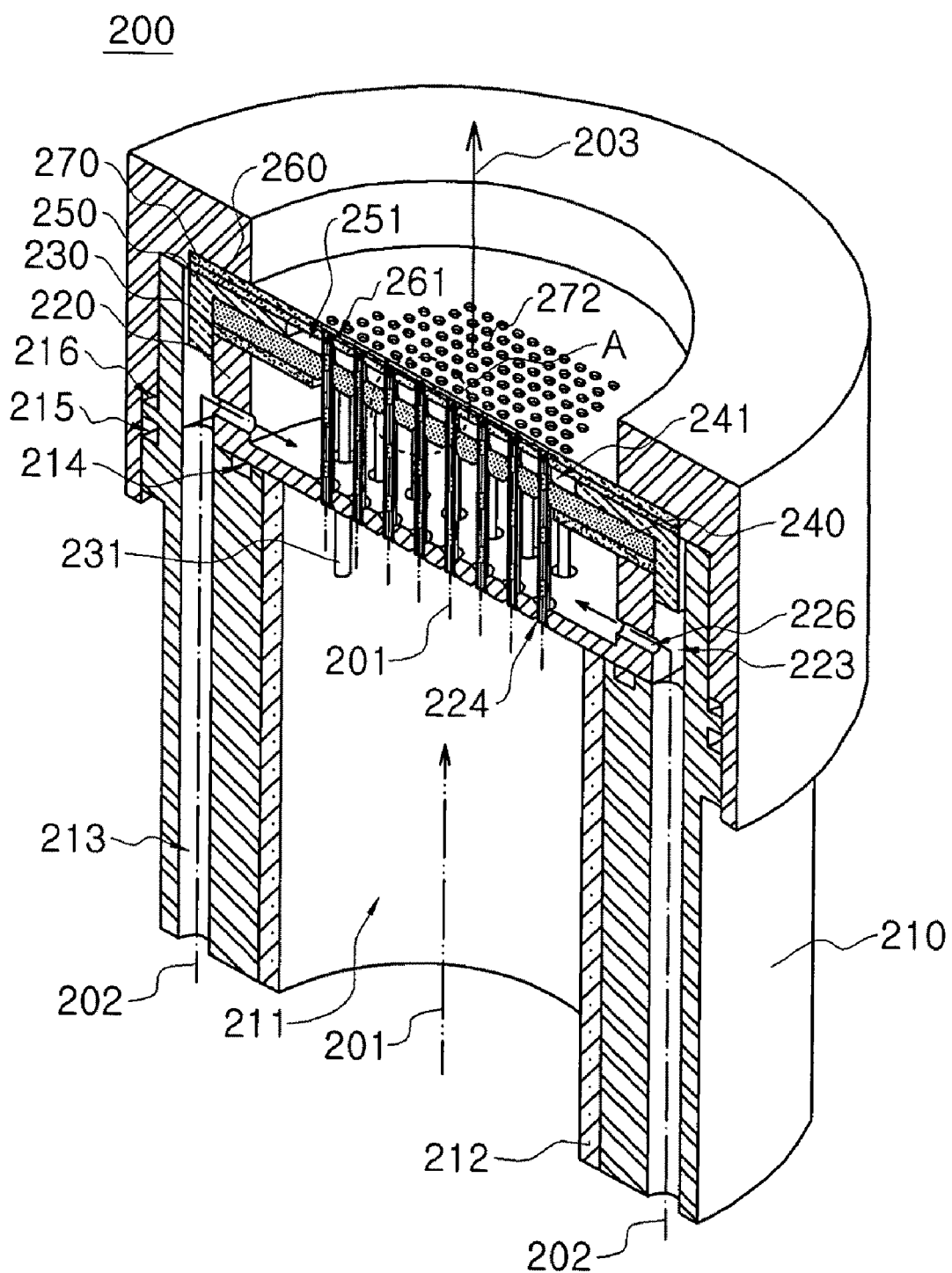
FIGS. 2 and 3A to 3H are partial cross-sectional perspective views of an atmospheric pressure plasma apparatus in accordance with an embodiment of the present subject matter.
Figure 3A:
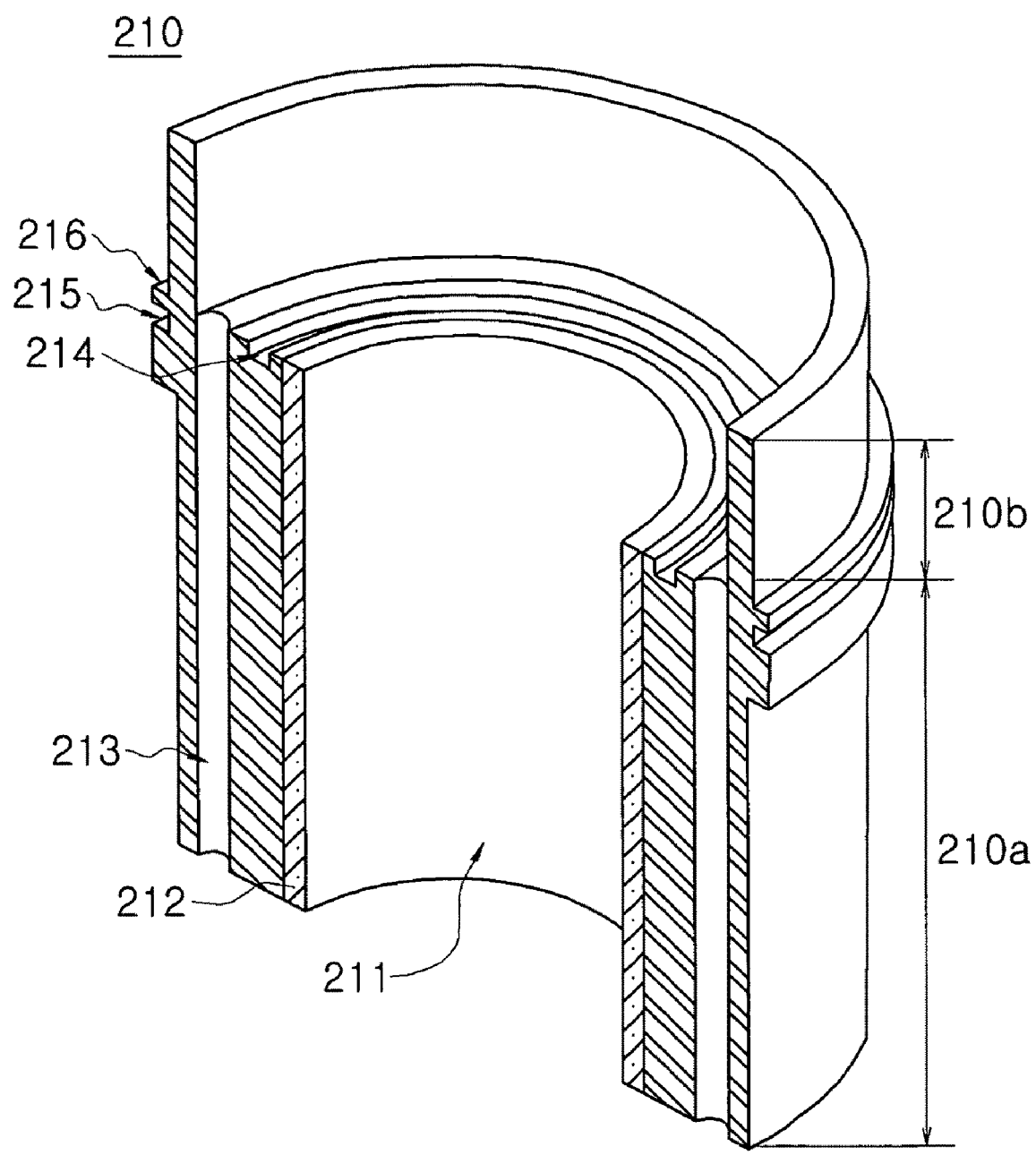

Referring to FIGS. 2 and 3A, the housing 210 forms a body of the atmospheric pressure plasma apparatus 100 together with the cap 280 and protects the inside of the atmospheric pressure plasma apparatus 100.

The housing 210 is classified into a gas supplying part 210a and an apparatus mounting part 210b. An internal space inside the housing 210 equivalent to the gas supplying part 210a includes a secondary gas chamber 211 for supplying secondary gas to a ceramic nozzle, which will be described hereinafter. On inner sidewalls of the secondary gas chamber 211, a secondary gas 201 may fill up the secondary gas chamber 211 and a housing insulator 212 for insulating the housing 210 may be provided.

A source-gas supplying pipe 213 for supplying a source gas 202 is disposed on inner sidewalls of the gas supplying part 210a. As shown, the thickness of inner sidewalls of the gas supplying part 210a and the apparatus mounting part 210b is different. That is, the thickness of the gas supplying part 210a is thicker than that of the apparatus mounting part 210b, so that a nozzle holder 220 can be mounted on the apparatus mounting part 210b.

At least two O-ring grooves may be included in the housing 210 in order to insert an O-ring. As shown, according to a first embodiment, a first O-ring groove 214, a second O-ring groove 215, and a third O-ring groove 216.

The first O-ring groove 214 performs a function to insert an O-ring for closing a space between the nozzle holder 220 and the housing 210. In addition, it is possible to prevent the secondary gas 210 filled in the secondary gas chamber 211 from being let out.

The second and third O-ring grooves 215 and 216 perform a function to insert an O-ring for closing a space between the cap 280 and the housing 210. In addition, it is possible to prevent internal gas or external gas from being let our or into the housing 210.

Figure 3B:
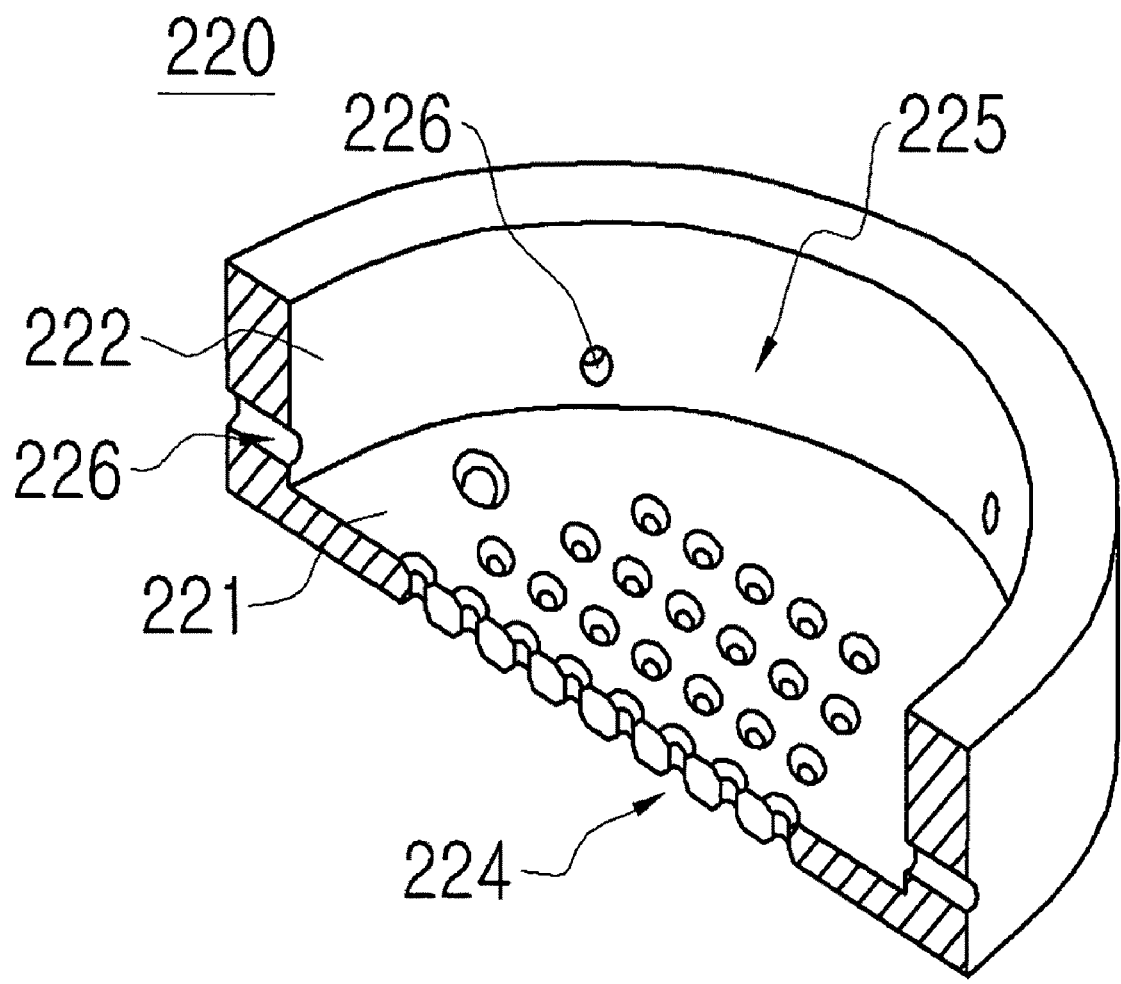

Referring to FIGS. 2 and 3B, the nozzle holder 220 is mounted on the apparatus mounting part 210b of the housing 210. The nozzle holder 220 includes a bottom 221 and sidewalls 222 thereof to be formed in a chalet shape. An external diameter of the nozzle holder 220 is smaller than an internal diameter of the apparatus mounting part 210b, so that a source-gas guide region 223 is defined between the sidewalls of the nozzle holder 220 and the housing 210. A secondary gas chamber 211 is defined by the gas supplying part 210a of the housing 210 and the bottom 221 of the nozzle holder 220 due to the mounting of the nozzle holder 220.

A plurality of third penetrating holes 224 are included on the bottom 221 of the nozzle holder 220. The bottom 221 includes an electrode-bar penetrating hole 225 for an electrode bar that is extended from a subsidiary electrode 230, which will be described. In FIG. 3, one electrode-bar penetrating hole 225 is shown, but several electrode-bar penetrating holes may be included.

At least one source-gas supplying hole 226 is disposed on the sidewalls 222 of the nozzle holder 220. The source-gas supplying hole 226 connects the source-gas guide region 223 and a source-gas chamber 225. Resultantly, a source gas 202 via a source-gas supplying pipe 213 is conformally supplied to the source-gas chamber 225.

The source-gas chamber 225 is defined by a subsidiary electrode 230, a first electrode 240, and the nozzle holder 220.

It is preferable that the nozzle holder 220 is formed of insulating material such as Teflon. The reason for this is to insulate the subsidiary electrode 230 and the first electrode 240, which are mounted on the nozzle holder 220.

Figure 3C:
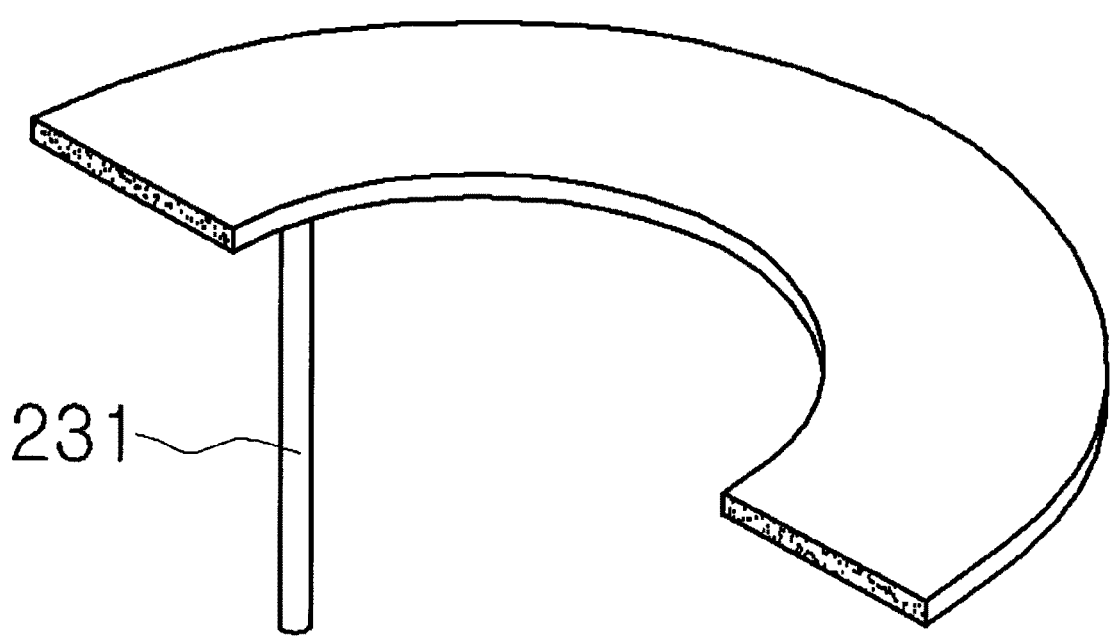

Referring to FIGS. 2 and 3C, the subsidiary electrode 230 is mounted on the nozzle holder 220 and has the same external diameter as that of the nozzle holder 220.

Preferably, the subsidiary electrode 230 is formed in a shape of a disk whose center's a predetermined region is empty. In this case, the predetermined region is equivalent to the third penetrating holes 22 included on the bottom 221 of the nozzle holder 220.

At least one electrode bar 231 is included on a bottom plate of the subsidiary electrode 230. The electrode bar 231 penetrates the electrode-bar penetrating hole 225 on the bottom 221 of the nozzle holder 220 to be extended.

The subsidiary electrode 230 conformally supplies power supply to a first electrode 240 as a whole.

Figure 3D:
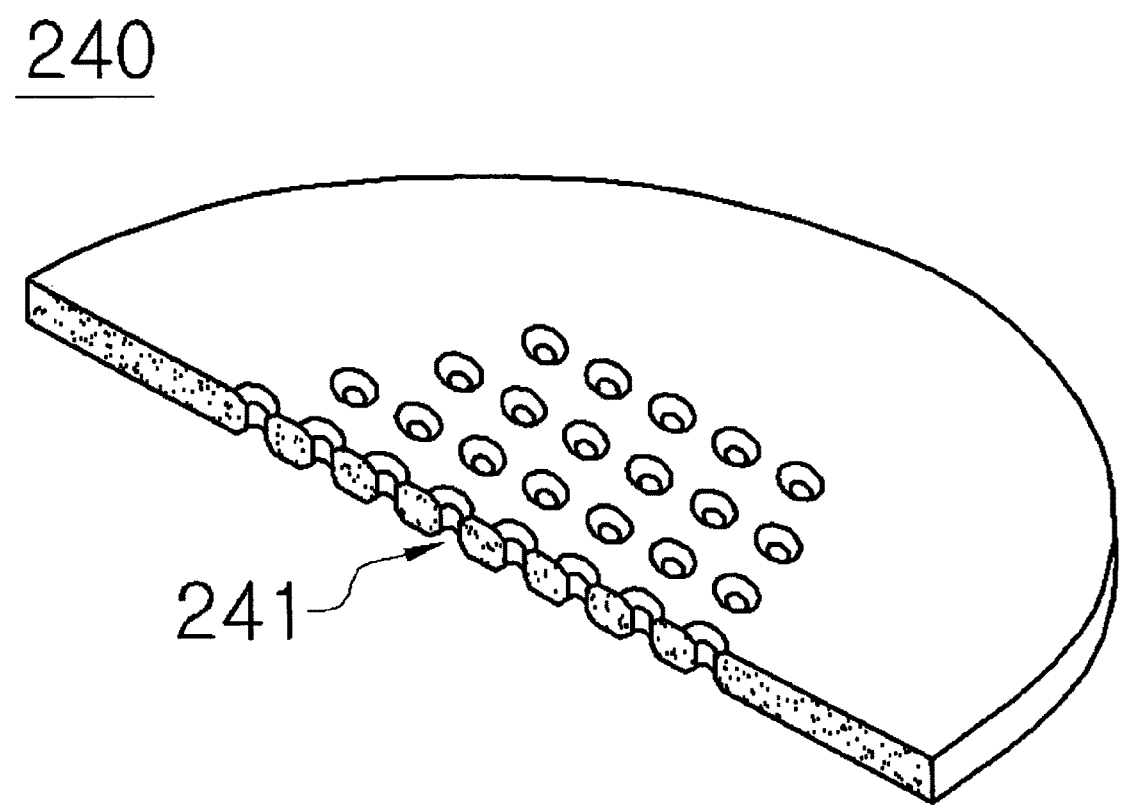

Referring to FIGS. 2 and 3D, the first electrode 240 is mounted on the subsidiary electrode 230. A source-gas chamber 242 is defined by the first electrode 240 and the nozzle holder 220. The source-gas chamber 242 is filled up with the source gas 202 that is supplied through the source-gas supplying pipe 213, the source-gas guide region 223, and the source-gas supplying hole 226.

The external diameter of the first electrode 240 is the same as that of the subsidiary electrode 230 and is formed in a shape of disk.

The first electrode 240 includes a plurality of first penetrating holes 241 at a position corresponding to the third penetrating hole 224 of the nozzle holder 220.

The first electrode 240 is made of porous material, so that the source gas 202 filled in the source-gas chamber 242 is easily passed. The source gas 202 passing through the source-gas chamber 242 is supplied to the first electrode 240 and an isolating space 251 defined by an electrode insulator 250 and the second electrode 251. The isolating space 251 is referred to as a "plasma generating region" because the source gas 202 is phase-changed into a plasma state.

Accordingly, due to the first electrode 240 formed of porous material, the source gas 202 is conformally supplied to the isolating space 251, thereby generating conformal plasma.

Figure 3E:
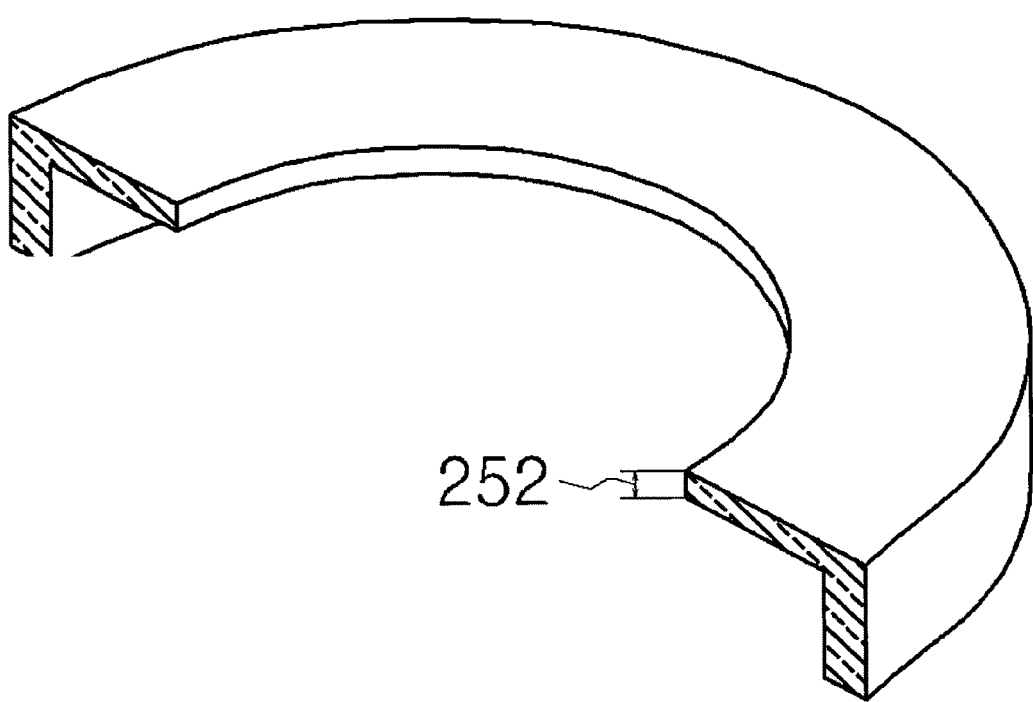

Referring to FIGS. 2 and 3E, an internal diameter of the electrode insulator 250 is the same as or greater than an external diameter of the subsidiary electrode 230 and the first electrode 240 and formed in a chalet shape.

Unlike the nozzle holder 220, the electrode insulator 250 is formed in a reverse-chalet shape of the nozzle holder 220 and is mounted on the first electrode 240 with covering the sidewalls of the subsidiary electrode 230 and the first electrode 240.

Similar to the subsidiary electrode 220, the electrode insulator 250 has an empty space in a predetermined region thereof. In this case, the predetermined region corresponds to the third penetrating hole 224 on the bottom 221 of the nozzle holder 220 and the first penetrating holes 241 of the first electrode 241.

Since the electrode insulator 250 insulates the first electrode 240 and a second electrode 250, it is preferable that it is made of insulating materials such as Teflon.

The thickness of a region equivalent to the bottom of the electrode insulator 250 defines an isolated distance, that is, a space between the first and second electrodes 240 and 260, of an isolating space 251.

Figure 3F:
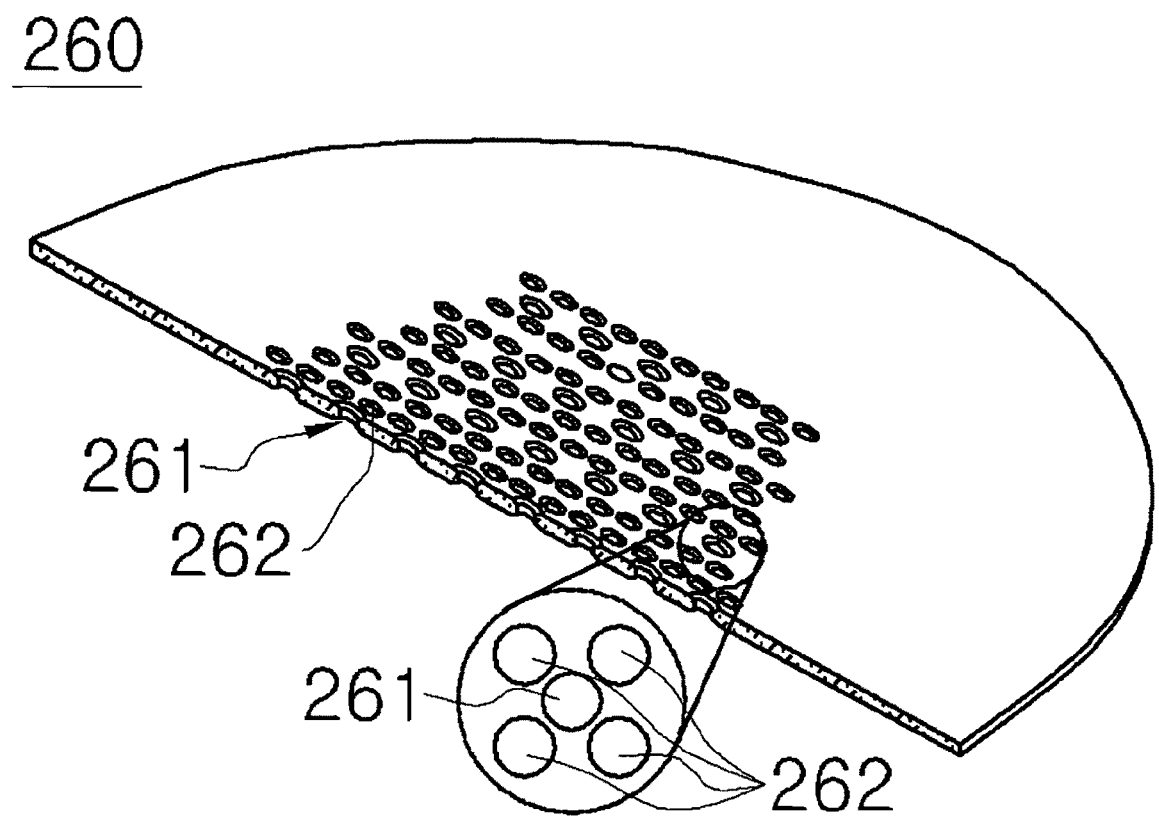

Referring to FIGS. 2 and 3F, the second electrode 260 is mounted on the electrode insulator 250.

The external diameter of the second electrode 260 is the same as that of the electrode insulator 250 and preferably formed in a disk shape.

The second electrode 260 includes the isolating space 251 apart from the first electrode as far as a predetermined distance. The isolating space 251 is isolated by the electrode insulator 250. As mentioned previously, the isolating space 251 is isolated corresponding to the thickness of the region equivalent to the bottom of the electrode insulator 250.

The isolating space 251 is referred to as a "plasma generating region" because the source gas 202 supplied via the first electrode 240 is phase-changed into a plasma state.

The second electrode 260 includes a plurality of second penetrating holes 261 at a position corresponding to the first and third penetrating holes 241 and 224 and the first connecting hole 262 for connecting the isolating space and the outside.

The first connecting hole 262 performs a function as a path for injecting plasma generated from the isolating space 251 to the outside.

The second electrode 260 a plurality of second penetrating holes 261 and first connecting holes 262. It is preferable that the first connecting holes 261 enclose the second penetrating holes 261. FIG. 3F show that four first connecting holes 261 enclose the second penetrating holes 261.

Figure 4:
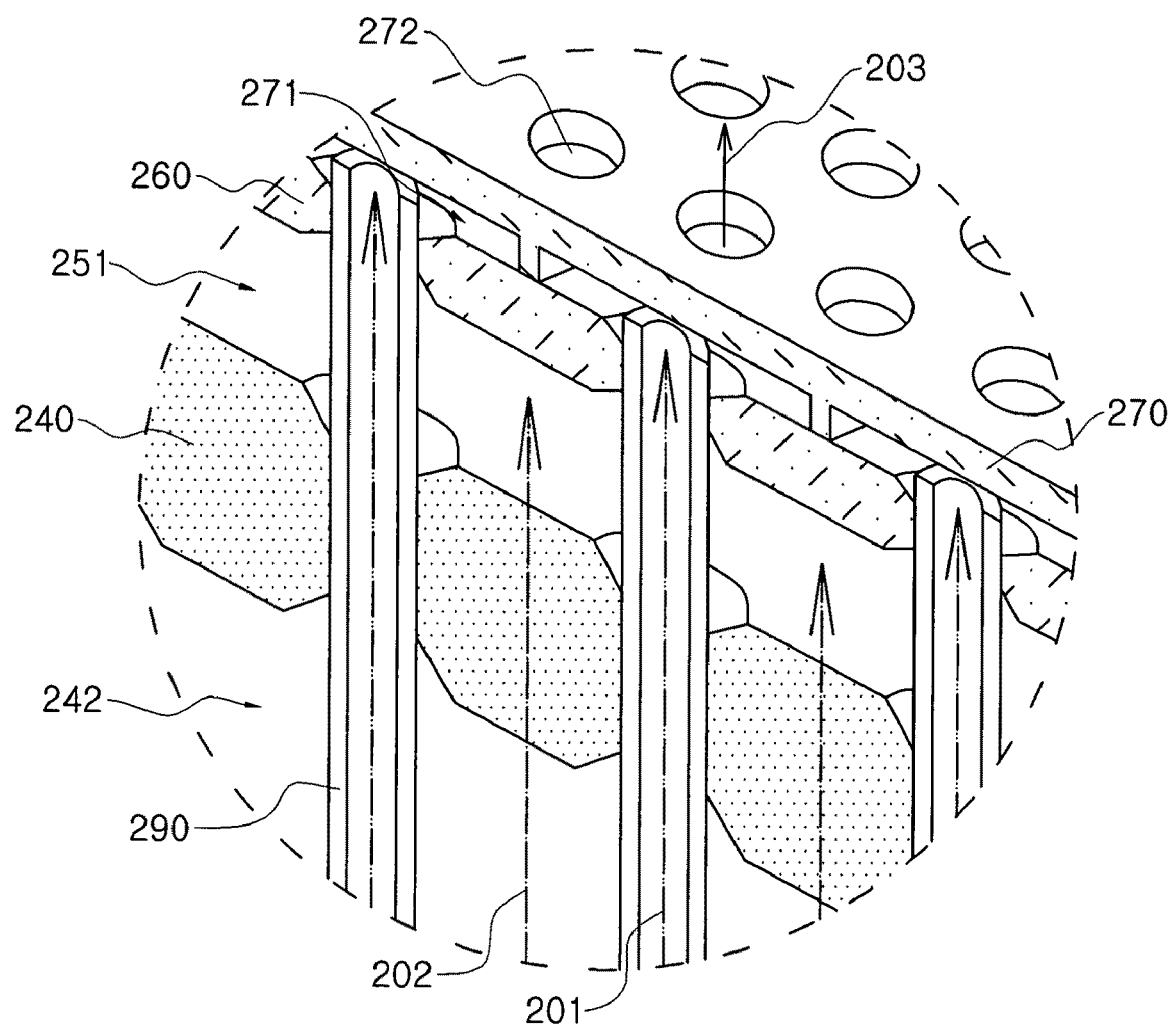
FIG. 4 is a drawing for magnifying a region of FIG. 1.

As shown in FIG. 4, one end of the atmospheric pressure plasma apparatus 200 is located at the secondary gas chamber 211, and the other end of that is protruded from the second electrode 260 toward the outside as much as a predetermined length. As a result, the secondary gas 201 supplied from the secondary gas chamber 211 is connected to the outside. At this time, the ceramic nozzle 290 penetrates the third penetrating hole 224, the first penetrating hole 241, and the second penetrating hole 261 sequentially.

Accordingly, unit cells are formed by at least four first connecting holes 262 at a center of the ceramic nozzle 290 on the second electrode 260. The unit cells are arranged on the second electrode 260 regularly. Depending on these unit cells, the secondary gas 210 injected from the ceramic nozzle 290 is conformally mixed with the plasma injected from the first connecting hole 262.

Figure 3G:
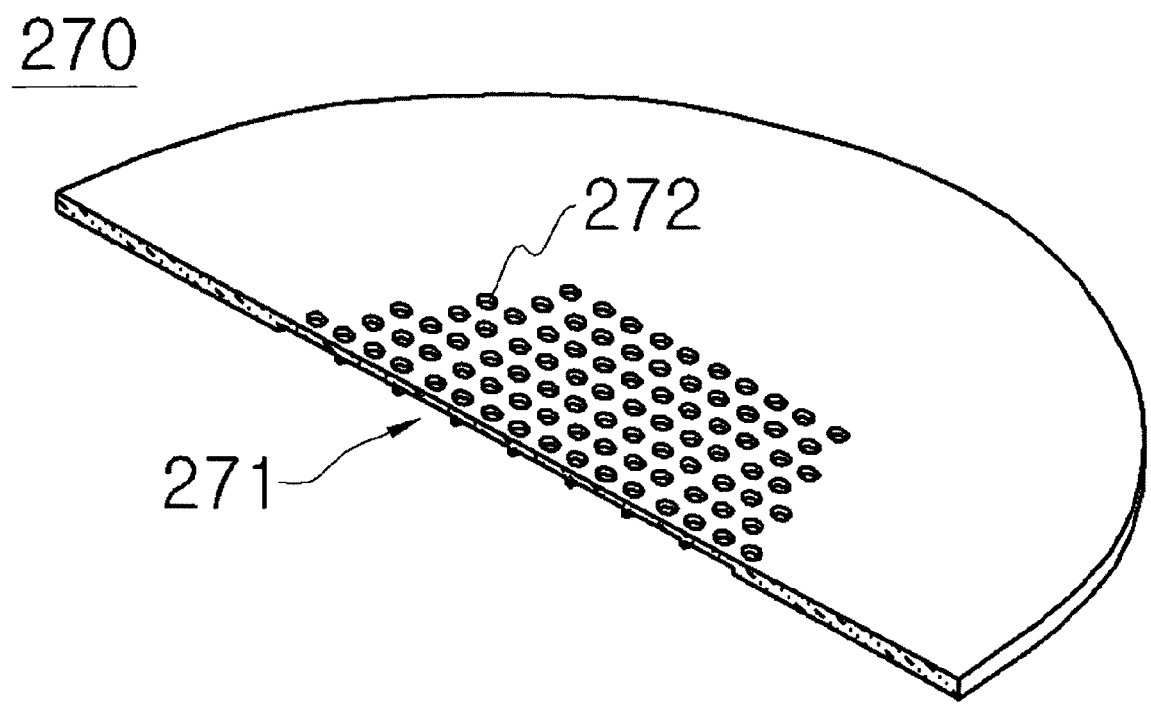

Referring to FIGS. 2 and 3G, the cover 270 may be mounted on the second electrode 260. In this case, the cover 270 may be omitted and included on occasion demands. The cover 270 has the same external diameter as the external diameter of the second electrode 260.

Additionally, the cover 270 includes at least one mixing groove 271 (See FIG. 4) on a surface contact with the second electrode 260. The mixing groove 271 includes at least one second connecting hole 272 for connecting the mixing groove 271 and the outside. That is, each of ends of the ceramic nozzle 290 is positioned in each of the mixing grooves 271.

The mixing groove 271 means a region in which the secondary gas injected form the ceramic nozzle 290 and the plasma injected from the first connecting hole 262 is mixed to form a mixed gas on the second electrode 260. Thus, the mixed gas, in other words, the secondary gas 201 mixed with the plasma is injected through the second connecting hole 272 to the outside.

Figure 3H:
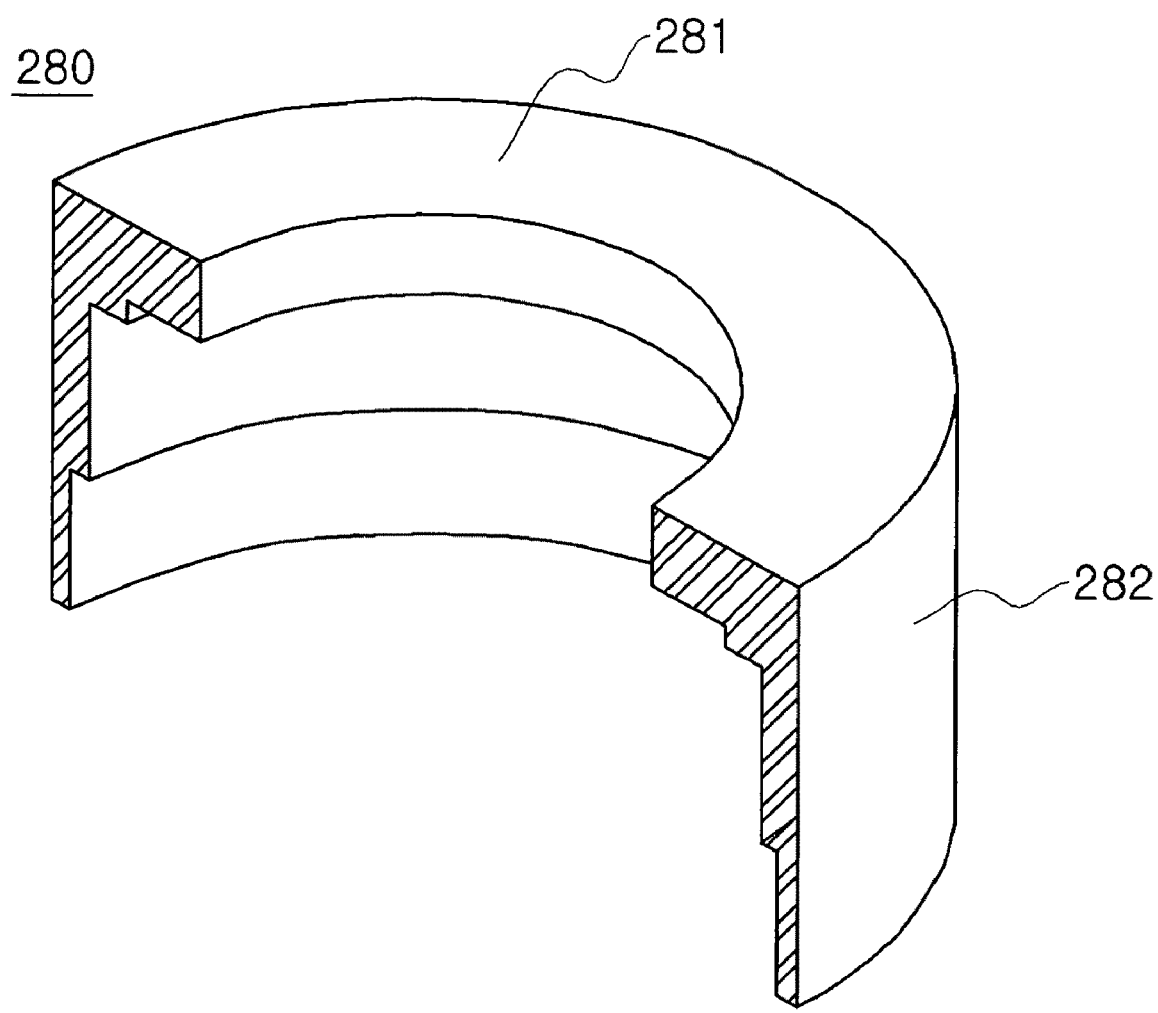

Referring to FIGS. 2 and 3H, the cap 280 fixes as well as closes several apparatus mounted on the apparatus mounting part 210b of the housing 210 at the same time.

The cap 280 may be classified into a bottom 281 and sidewalls 282. A region corresponding to the second electrode 260 or the second penetrating hole 261 of the cover 270, the first connecting hole 262, and the second connecting hole 272 of the bottom 28 is empty. At the same time, the sidewalls 282 cover a predetermined region of sidewalls of the housing 210.

The second O-ring groove 215 and third O-ring groove 216 are disposed between the cap 280 and the housing 210, thereby helping close a space therebetween.

In the atmospheric pressure plasma apparatus 200 according to the first embodiment of the present subject matter, if power supply is applied to the first and second electrodes 240 and 260, as shown in FIGS. 1 and 4, the source gas 202 is phase-changed into a plasma state in the isolating space 251 of the first and second electrode 240 and 260.

As mentioned previously, the source gas 202 is supplied through the source-gas supplying pipe 213 and the source-gas guide region 223 from the outside to the source-gas chamber 242. Then, the source gas 202 is supplied through the first electrode 240 from the source-gas chamber 242 to the isolating space 251.

The plasma is injected to the outside through the first connecting hole 262 of the second electrode 260. Due to the cover 270 of FIGS. 1 and 4, the plasma is injected to the mixing groove 271.

The secondary gas 201 supplied from the outside fills the secondary gas chamber 211, and then injected through the ceramic nozzle 290 from the second electrode 260 to the outside or the mixing groove 271.

The secondary gas 201 injected to the outside or the mixing groove 217 and the source gas 202 phase-changed into plasma is changed into conformal mixed gas 203 to be injected into a processing object or a processing region.

According to the first embodiment of the atmospheric pressure plasma apparatus 200, the source gas 202 passes the first electrode 240 to be supplied to the isolating space 251 equivalent to a plasma generating region. Such the source gas 202 is phase-changed into plasma in the plasma generating region, and then conformally injected to the outside through the first connecting hole 124 of the second electrode 120. The secondary gas 201 passes the isolating space 251 through the ceramic nozzle 290 with isolating the plasma generated in the plasma generating region. Then, the secondary gas 201 is injected through the ceramic nozzle 290 protruded from the second electrode 260 as mush as a predetermined length and mixed with the plasma injected through the first connecting hole 262 to be conformally dissolved. As a result, the reagent of the secondary gas 201 is improved.

At this time, it does not mean that the secondary gas 201 is dissolved in the plasma generating region to be injected to the outside, but that the secondary gas 201 is reacted with the plasma in the outside to be dissolved, so that the movable course of the dissolved secondary gas 201 becomes shortened, thereby minimizing the loss of reagent of the dissolved secondary gas 201.

In the atmospheric pressure plasma apparatus 100 in accordance with the present subject matter, the first connecting hole 262 and the ceramic nozzle 290 are conformally arranged on the second electrode 260, thereby generating conformal plasma in the light of space. Also, the secondary gas 180 dissolved by the plasma is conformally generated, thereby improving the dissolvability of the secondary gas 201.

As mentioned above, the atmospheric pressure plasma apparatus 200 may be used in numerous applications such as modifying surface properties of materials, etching, coating, sterilization, disinfecting, generating ozone, dyeing, cleaning waste water, cleaning faucet water, air cleaning, and high-gain lamps, and nanotube growing.

EXAMPLE 2

Figure 5A:
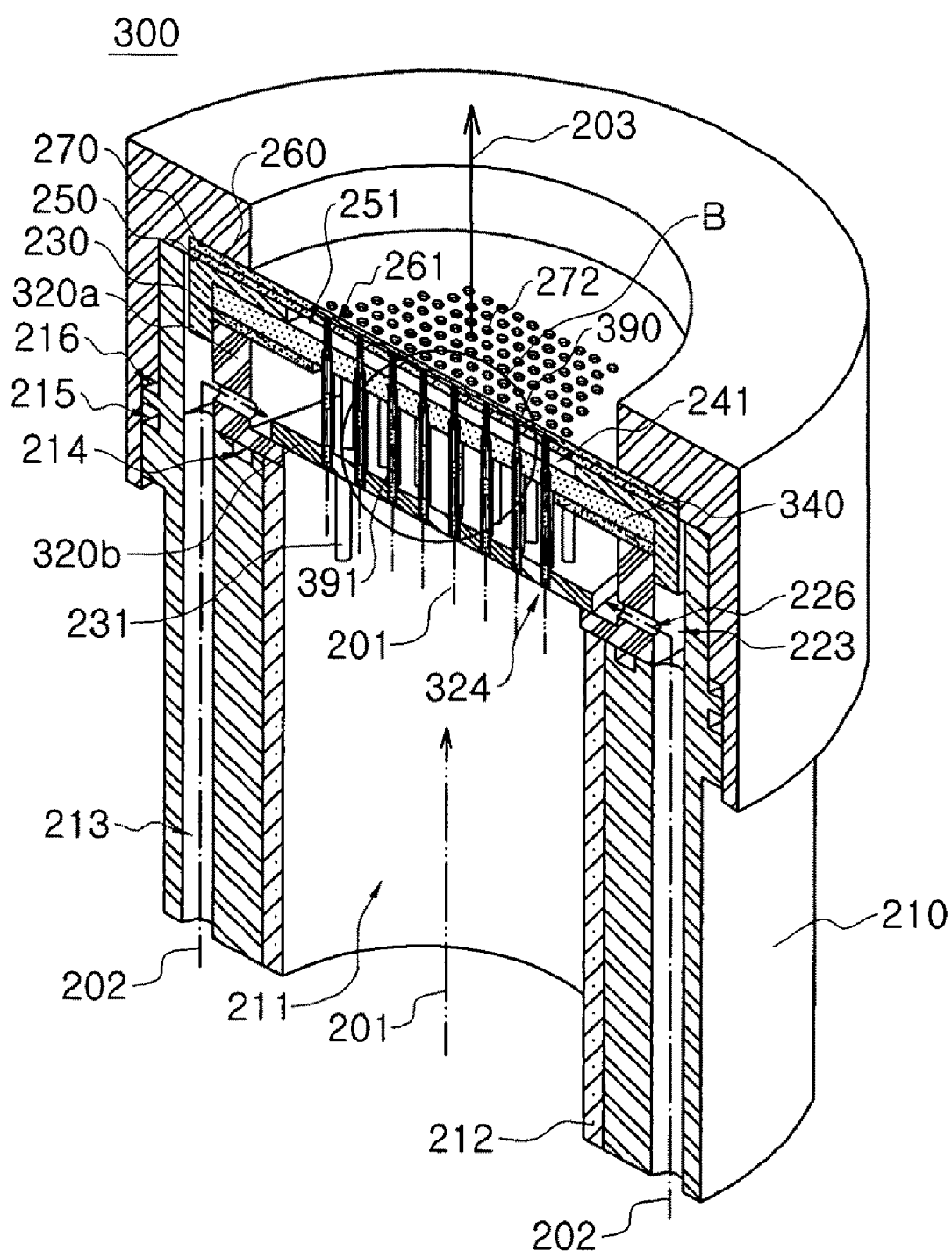
FIGS. 5A and 5B are partial cross-sectional perspective views of an atmospheric pressure plasma apparatus in accordance with another embodiment of the present subject matter.
Figure 5B:
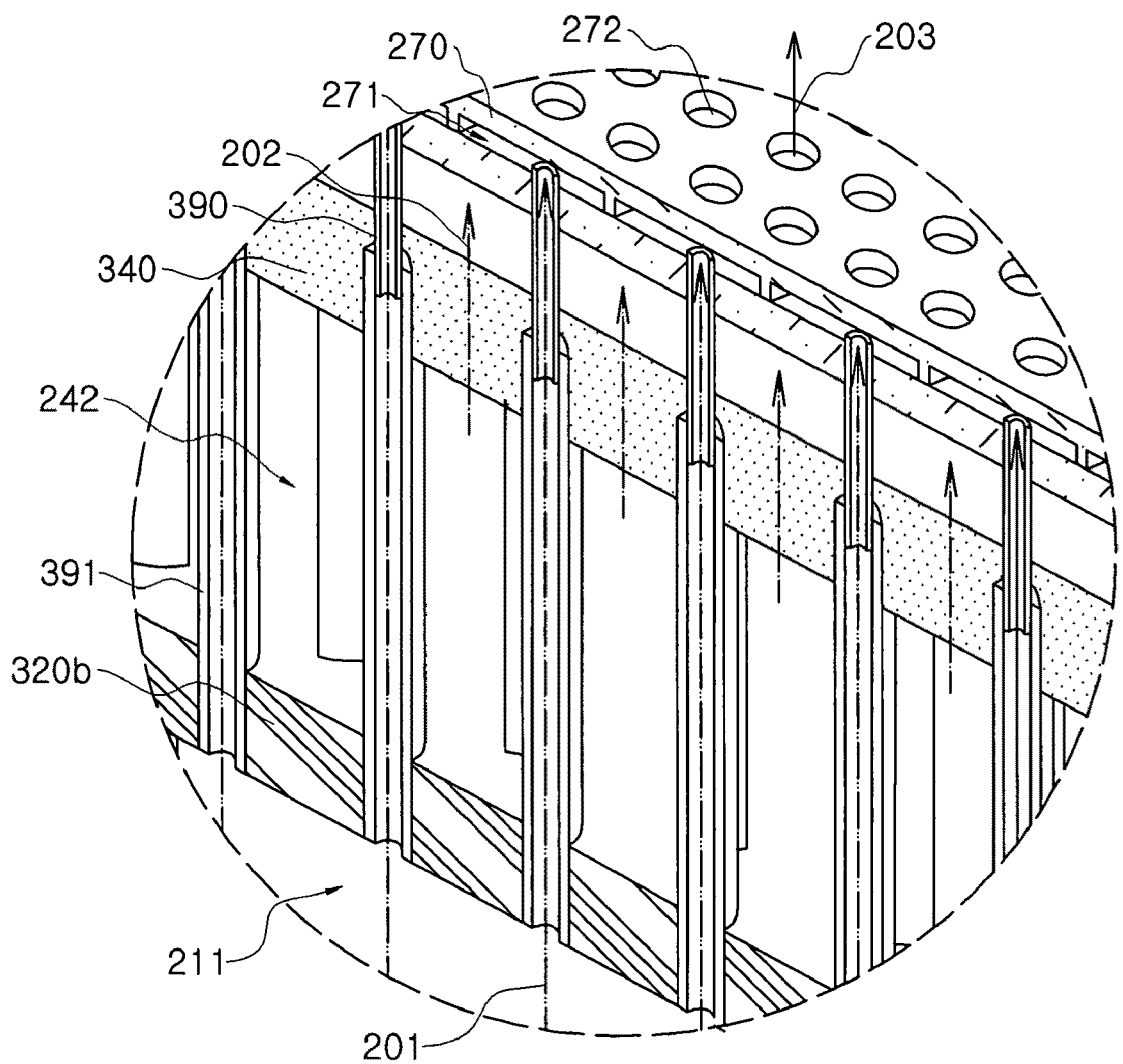

FIGS. 5A and 5B are partial cross-sectional perspective views of an atmospheric pressure plasma apparatus in accordance with a second embodiment of the present subject matter. FIG. 5B is a magnify drawing of region B of the FIG. 5B.

Referring to FIGS. 5A and 5B, an atmospheric pressure plasma apparatus 300 according to a second embodiment of the present subject matter is the same as that according to the first embodiment of the present subject matter exception that elements correspond to the nozzle holder 220, the first electrode 240, and the ceramic nozzle 290 of the first embodiment of the present subject matter.

The same parts as those described in the first embodiment are represented with like reference numerals and their explanation will be omitted.

A nozzle insulator 320a is mounted on an apparatus mounting part 210b of the housing 210. In this case, the nozzle insulator 320a is formed in a chalet shape like the nozzle holder 220 of the first embodiment. The bottom center of the nozzle insulator 320a is empty.

The nozzle holder 320a is shown as disk-shaped and is mounted on the nozzle holder 220 according to the first embodiment. The nozzle holder 320a according to the second embodiment is formed in a shape such that only a center part of the bottom 221, including the third penetrating hole 224 of the nozzle holder 220, is separated.

As shown in FIGS. 5A and 5B, one end of the base tube 391 is embedded with the third penetrating hole 224, and the other end of is connected to the first electrode 340, corresponding to the first electrode 240 of the first embodiment. Resultantly, the base tube 391 is connected from the nozzle holder 320b to the first electrode 340.

In this case, the base tube 391 does not penetrate the nozzle holder 320b and the first electrode 340, and is embedded in a predetermined depth.

The ceramic nozzle 390 is inserted into the base tube 391 to be fastened at predetermined depth on the other end of the base tube 391. As described in first embodiment, the ceramic nozzle 390 is protruded at predetermined length.

In the second embodiment, the elements are the same those as described in the first embodiment exception of the nozzle insulator 320a, the nozzle holder 320b, the base tube 391, the ceramic nozzle 390, and the second electrode 360.

That is, the nozzle holder 220 of the first embodiment is formed as one body. In the second embodiment, the nozzle insulator 320a and the nozzle holder 320b are separated. Also, whereas the ceramic nozzle 290 is disposed as one body from the nozzle holder 220 to the second electrode 260 in the first embodiment, the base tube 391 is disposed from the nozzle holder 320b to the half way of the first electrode 340, and the ceramic nozzle 390 is disposed from the base tube 391 to the second electrode 360. Except for the herein described differences between the first and second embodiments, other elements, and their effects may be the same.

Figure 6:
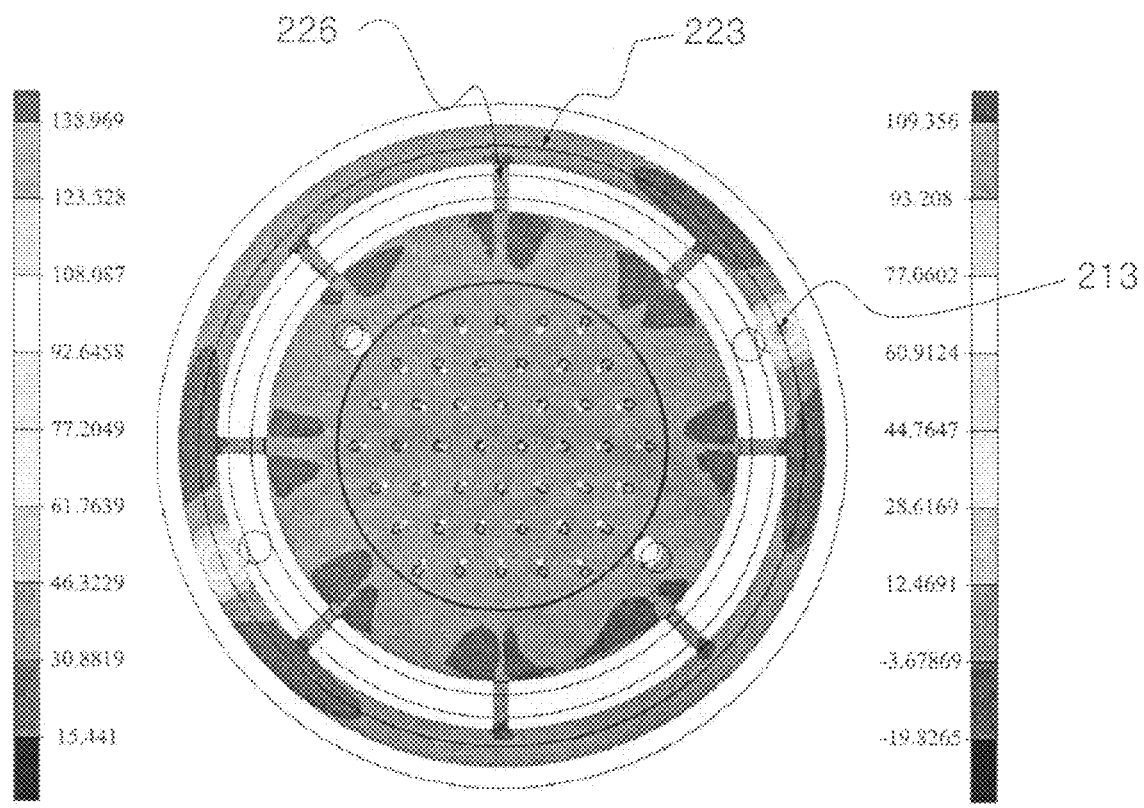
FIG. 6 shows the flow of source gas of the atmospheric pressure plasma apparatus according to first embodiment of the present subject matter.

FIG. 6 shows the flow of source gas of the atmospheric pressure plasma apparatus according to the first embodiment of the present subject matter.

Referring to FIG. 6, the current velocity of the source gas 202 in the source gas chamber 225 of the atmospheric pressure plasma apparatus 200 is measured. As shown in FIG. 6, the flow of the source gas 202 supplied through the source gas supplying pipe 213 in the source-gas guide region 223 is conformal as a whole.

This means that the source gas 202 is conformally distributed in the source gas chamber 225. Such conformal distribution means that the source gas 202 contact with the first electrode 240 is conformal, and the source gas 202 penetrating the first electrode 240 is also conformal.

Thus, the source gas 202 passing over the first electrode 240 is conformal, thereby conformally providing the source gas 202 to the isolating space 251 being the plasma generating region. As a result, conformal plasma can be created.

As shown in FIG. 6, the uniform flow of the source gas 202 in the source gas chamber 225 means that the plasma created in the atmospheric pressure plasma apparatus 200 is generated conformally.

According to the present subject matter, the atmospheric pressure plasma apparatus is capable of minimizing the loss of reagent of dissolved secondary gas.

In addition, the atmospheric pressure plasma apparatus is capable of generating plasma that is uniformed in the light of space.

Further, the atmospheric pressure plasma apparatus enhances the dissolvability of the secondary gas by uniformly mixing the plasma and the secondary gas.

Although various embodiments of the present subject matter have been described herein for illustrative purposes, those skilled in the art will appreciate that various modifications, additions and substitutions are possible, without departing from the scope and spirit of the subject matter as disclosed in the accompanying claims.

What is claimed is:

1. An atmospheric pressure plasma apparatus comprising:
   a first electrode being porous and having a plurality of first penetrating holes;
   a second electrode forming an isolating space keeping the certain distance having second penetrating holes corresponding to the first penetrating holes and a plurality of first connecting holes for connecting the isolating space and an outer region;
   a ceramic nozzle penetrating the first and second penetrating holes to be connected to the outer region; and
   a cover disposed on the second electrode, including at least one mixing groove, and a second connecting hole for connecting the mixing groove and the outside,
   wherein a source gas is provided to the isolating space through the first electrode,
   wherein a secondary gas passes the isolating space through the ceramic nozzle to the outer region,
   wherein a radio frequency power supply is applied to the first and second electrodes to generate plasma in the isolating space from the source gas supplied through the first electrode,
   wherein the plasma is injected to the outer region through the first connecting holes, and
   wherein if the secondary gas passing the isolating space through the ceramic nozzle is injected to the outer region, the plasma and the secondary gas is mixed in the outer region,
   wherein at least one connecting hole and at least one ceramic nozzle having ends are connected to provide the secondary gas and plasma to each of the mixing grooves, and
   wherein the secondary gas mixed with the plasma is injected to the outside through second connecting hole.

2. The atmospheric pressure plasma apparatus according to claim 1, wherein each of the ends of the ceramic nozzle is positioned in each of the mixing grooves.

3. An atmospheric pressure plasma apparatus comprising:
   a housing having an internal space including a gas supplying part and an apparatus mounting part, wherein a secondary gas chamber is formed in the gas supplying part, and a source gas supplying pipe is formed inside wall of the gas supplying part;
   a nozzle holder mounted on the apparatus mounting part of the housing and formed in a shape to include a source gas chamber defined by a bottom and sidewalls of the housing, the nozzle holder having an external diameter smaller than an internal diameter of the mounting part to supply a source gas from the source gas supplying pipe to a source-gas guide region of the housing, the nozzle holder including a plurality of third penetrating holes in the bottom thereof, the nozzle holder including at least one source gas supplying hole for connecting the source-gas guide region and the source gas chamber;
   a subsidiary electrode mounted on the nozzle holder, having the external diameter the same as that of the nozzle holder, and formed in a shape of a disk whose center's a predetermined region is empty;
   a disk-shaped first electrode mounted on the subsidiary electrode, including a plurality of first penetrating holes corresponding to the third penetrating holes of the nozzle holder, and formed of porous materials;
   an electrode insulator formed in a shape having an internal diameter the same as or greater than an external diameter of the subsidiary electrode, mounted on the first electrode with sidewalls of the subsidiary electrode and the first electrode covered, and including a bottom whose center's predetermined region is empty;
   a disk-shaped second electrode mounted on the electrode insulator, having the same diameter the same as an external diameter of the electrode insulator, forming an isolating space keeping the certain distance from the first electrode by the electrode insulator, including a first connecting hole for connecting the isolating space and an outside, and including a second penetrating hole corresponding to the first penetrating hole;
   a ceramic nozzle included to penetrate the third penetrating hole of the nozzle holder, the first penetrating hole of the first electrode, and the second penetrating hole of the second chamber; and
   a cap exposing a central region of the second electrode and sealing the internal space of the housing by simultaneously covering an edge of the second electrode and a predetermined region of the housing,
   wherein a radio frequency power supply is applied to the first and second electrodes to generate plasma in the isolating space from the source gas supplied through the first electrode,
   wherein the plasma is injected to the outer region through the first connecting holes, and wherein if the secondary gas passing the isolating space through the ceramic nozzle is injected to the outer region, the plasma and the secondary gas is mixed in the outer region.

4. The atmospheric pressure plasma apparatus according to claim 3, wherein the ceramic nozzle penetrating the second electrode and the first connecting hole being an unit cell covered with at least one second connecting holes on the ceramic nozzle is disposed on the second electrode, and wherein the number of the unit cell is at least one.

5. The atmospheric pressure plasma apparatus according to claim 4, further comprising a cover disposed between the second electrode and the housing, having the external diameter the same as that of the second electrode, including at least one mixing groove, and a second connecting hole for connecting the mixing groove and the outside,
wherein at least one connecting hole and at least one ceramic nozzle are connected to provide the secondary gas and plasma to each of the mixing grooves, and
wherein the secondary gas mixed with the plasma is injected to the outside through second connecting hole.

6. The atmospheric pressure plasma apparatus according to claim 5, wherein each of ends of the ceramic nozzle is positioned in each of the mixing grooves.

7. The atmospheric pressure plasma apparatus according to claim 5, further comprising an electrode connecting rod to be connected to the outside power supply in the bottom of the subsidiary electrode, wherein the electrode connecting rod penetrating the nozzle holder to be extended to the gas supplying part.

8. The atmospheric pressure plasma apparatus according to claim 5, further comprising a housing insulator for insulating the housing and the secondary gas on walls corresponding to the gas supplying part of the housing.

* * * * *